(12) United States Patent
Gravrand et al.

(10) Patent No.: US 8,786,042 B2
(45) Date of Patent: Jul. 22, 2014

(54) PHOTODETECTOR WITH A PLASMONIC STRUCTURE

(75) Inventors: Olivier Gravrand, Fontanil Cornillon (FR); Gérard Destefanis, Saint Egreve (FR); Jérôme Le Perchec, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 478 days.

(21) Appl. No.: 12/955,659

(22) Filed: Nov. 29, 2010

(65) Prior Publication Data

US 2011/0156189 A1 Jun. 30, 2011

(30) Foreign Application Priority Data

Dec. 24, 2009 (FR) ...................................... 0959567

(51) Int. Cl.
*H01L 31/0232* (2014.01)
(52) U.S. Cl.
USPC .......................................... 257/436; 257/736
(58) Field of Classification Search
CPC ............ H01L 31/1832; H01L 31/0296; H01L 31/1032; H01L 31/0232; H01L 31/02966
USPC ........................................................ 257/436
See application file for complete search history.

(56) References Cited

U.S. PATENT DOCUMENTS

| | | | |
|---|---|---|---|
| 2003/0122210 A1* | 7/2003 | Cohen et al. | 257/465 |
| 2008/0217542 A1* | 9/2008 | Verma et al. | 250/370.01 |
| 2009/0146198 A1 | 6/2009 | Joe et al. | |
| 2011/0216229 A1* | 9/2011 | Mary et al. | 348/273 |

FOREIGN PATENT DOCUMENTS

| | | |
|---|---|---|
| EP | 1247301 A1 | 10/2002 |
| FR | 2842945 A1 | 1/2004 |

OTHER PUBLICATIONS

Republique Francaise, Rapport De Recherche Preliminaire International Search Report, dated Oct. 15, 2010, 2 pgs.
Resonances Photoniques Dans Les Reseaux Metalliques: Theorie Et Application a La Photodetection Ultrarapide, Stephane Collin, Docteur de l'Universite Paris 6, dated Jul. 22, 2002, 251 pgs.
Plasmon-Based Photosensors Comprising a Very Thin Semiconducting Region; J. Le Perchec, et al., Published May 7, 2009, 3 pages.

* cited by examiner

*Primary Examiner* — Thao X Le
*Assistant Examiner* — Geoffrey Ida
(74) *Attorney, Agent, or Firm* — Harris Beach PLLC

(57) ABSTRACT

This photodetector capable of detecting electromagnetic radiation comprises:
- a doped semiconductor absorption layer for said radiation, capable of converting said radiation into charge carriers;
- a reflective layer that reflects the incident radiation that is not absorbed by semiconductor layer towards the latter, located underneath semiconductor layer; and
- a metallic structure placed on semiconductor layer that forms, with semiconductor layer, a surface Plasmon resonator so as to concentrate the incident electromagnetic radiation on metallic structure in the field concentration zones of semiconductor layer. Semiconductor zones for collecting charge carriers that are oppositely doped to the doping of semiconductor layer are formed in said semiconductor layer and have a topology that complements that of the field concentration zones.

13 Claims, 5 Drawing Sheets

PHOTODETECTOR WITH A PLASMONIC STRUCTURE

CROSS REFERENCE TO RELATED APPLICATION

This application claims the benefit of French Patent Application No. 0959567, filed Dec. 24, 2009. The entirety of this application is incorporated herein by reference.

FIELD OF THE INVENTION

The present invention relates to the detection of electromagnetic radiation, especially infrared, using so-called metallic "plasmonic structures".

BACKGROUND OF THE INVENTION

One known method of detecting infrared radiation involves obtaining absorption of this radiation by a layer of small-gap semiconductor material such as CdHgTe for example. The absorption of photons by this layer then creates electron-hole pairs and the minority carriers thus produced diffuse or drift due to the effect of an electric field in the absorption layer so that they can subsequently be collected at the level of pn junctions then electrodes. Detection quality is then dictated primarily by the dimensions of the absorption layer.

In fact, the quantum efficiency of detection improves, the thicker this layer is. At the same time, the dark current, which is one of the main sources of noise with this type of detection, rises as the volume for collecting the photocarriers increases. Thus, designing such detection must strike a compromise between detection efficiency, as defined by the quantum efficiency, and the quantity of noise that is present in the signal obtained from detection which is partly generated by the dark current.

In order to overcome this problem, photodetectors of the Metal-Semiconductor-Metal (MSM) type having so-called metallic "plasmonic" structures on their absorption layer(s) have been proposed. Coupling between the incident electromagnetic radiation and surface plasmons is obtained in this way. Making an appropriate choice of said structures, which usually take the form of straight, parallel strips having a rectangular cross-section, then allows very considerable confinement of the electromagnetic field in the absorption layer, thus producing a significant reduction in the dark current.

Besides confining the electromagnetic field in a restricted space, plasmonic structures also make it possible, under certain geometric conditions, to reduce the response time of the detector which is related to the rate at which carriers diffuse into the absorption layer and they also make it possible to apply spectral filtering or polarization selectivity.

Document EP1247301 discloses a MSM photodetector with a plasmonic structure comprising metallic strips that alternate with semiconductor strips, this assembly being formed on an electrically insulating layer. The metallic strips form plasmonic structures and thus concentrate the electromagnetic field in the semiconductor strips. However, the metallic strips also act as an electrode for collecting photocarriers produced in the semiconductor strips.

The response time of such a photodetector is primarily dictated by the time that elapses between a photocarrier being created by the absorption of a photon by the semiconductor material and the instant at which that photocarrier is collected by the collecting electrodes. In order to reduce this collection time, it is consequently useful to reduce the time which it takes for the photocarriers to diffuse into the semiconductor material, in this case the semiconductor strips.

In the previous configuration, the geometry of the electrodes is imposed by the plasmonic resonance effect that is exploited and this geometry is determined and set by the wavelength that is to be detected. The way of reducing the collection time is then to use a so-called "interdigitated comb" architecture in which two consecutive strips are differently polarized, thus allowing collection by metal-semiconductor junctions formed where the strips come into contact with the absorbing material. The main drawback of this type of structure is the fact that it imposes two contacts per pixel in order to benefit from its maximum speed.

Similarly, Document FR 2 842 945 suggests forming metallic strips that form plasmonic structures on a semiconductor layer and providing a reflective layer underneath the semiconductor structure in order to obtain concentration of the electromagnetic field in the semiconductor layer that supports the metallic strips. The electric strips also act as collecting electrodes here, and so the same interfacing and wiring problem is encountered.

SUMMARY OF THE INVENTION

The object of the present invention is to solve the aforementioned problem by proposing a photodetector capable of detecting electromagnetic radiation and having an optimal response time, regardless of the plasmonic structure used.

To achieve this, the object of the invention is a photodetector comprising:

a doped semiconductor absorption layer for said radiation, capable of converting said radiation into charge carriers;

a reflective layer that reflects the incident radiation that is not absorbed by the semiconductor layer towards the latter, located underneath the semiconductor layer; and a metallic structure placed on the semiconductor layer that forms, with the latter, a surface plasmon resonator so as to concentrate an incident electromagnetic field (the incident electromagnetic radiation) on the metallic structure in the field concentration zones of the doped semiconductor layer.

According to the invention, the semiconductor zones for collecting charge carriers generated by the semiconductor layer that is oppositely doped to the doping of said semiconductor layer are formed in the semiconductor layer and have a topology that complements that of the field concentration zones.

The term "topology that complements" here is taken to mean that the semiconductor zones are placed in locations of the semiconductor layer that are devoid of field concentration zones. The field concentration zones and the semiconductor collection zones are thus negatives of each other.

In other words, the semiconductor zones formed in the semiconductor absorption layer form, together with the latter, PN junctions and, consequently, zones for collecting the charge carriers created in said layer. Every semiconductor collection zone collects the carriers in its immediate vicinity. This immediate vicinity consists of electromagnetic field concentration zones where charge carriers are created by absorption. Each of the field concentration zones is in contact with a PN collection junction so that the charge carrier diffusion time is thus minimal.

In addition, by forming a grid of semiconductor zones, one obtains a plurality of unitary detection elements, and hence two-dimensional detection, without having to fabricate distinct unitary elements that are then separately mounted on a substrate. In particular, metallic plasmonic structures can be continuous and extend over the entire surface area of the photodetector if the application so demands.

According to one embodiment of the invention:

the metallic structure comprises spaced-apart structures (grid of strips, bump contacts or holes, etc.), the geometry and spacing of the structures relative to each other being selected so that the field concentration zones are produced between the structures;

and the semiconductor charge collecting zones are produced underneath the structures and have the same topology as the latter.

In particular, the structures are located so that they are in contact with the semiconductor charge collecting zones.

In other words, this embodiment is especially suitable if the electromagnetic field is confined between the structures. In addition, fabricating such a photodetector is simplified and precise insofar as the structures, strips for example, can be formed, for instance, by etching or by over-etching the semiconductor layer which naturally produces doping of the over-etched areas. Adopting this procedure, the structures and semiconductor charge collecting zones are produced simultaneously and are self-aligning. In addition, the structures can be used to bring the semiconductor charge collecting zones to a predetermined potential in order to operate the PN junctions.

According to another embodiment of the invention:

the metallic structure comprises spaced-apart structures (grid of strips, bump contacts or holes, etc.), the geometry and spacing of the structures relative to each other being selected so that the field concentration zones are produced underneath the structures;

and the semiconductor zones are produced between the structures and have the same topology as the space between them.

In particular, the semiconductor zones are electrically isolated from the structures.

In other words, this embodiment is suitable if the magnetic field is confined underneath the structures. As with the previous production method, fabricating such a device can be drastically simplified by using metallic structures as a mask during an ion implantation step, thus allowing self-alignment of the structures and charge collecting junctions thus created.

According to one embodiment, the photodetector comprises, for each elementary detection surface, a detection array and a conductor that passes through the photodetector from the reflective layer to at least one semiconductor charge collecting zone. In particular, the conductor passes through the semiconductor layer to a structure with the structures associated with the elementary detection surface being capable of being electrically connected to each other. Also, the conductor may comprise, on the reflective layer side, a contact pad surface in order to hybridize the photodetector on an electronic circuit.

In other words, thanks to the presence of PN junctions which make it possible to collect charge carriers, it is possible to collect the current generated by the side opposite to that where the metallic structure is located and thus provide hybridization.

According to one embodiment of the invention, the part of the metallic structure associated with each elementary detection surface of a detection array comprises areas having differently orientated parallel patterns, especially areas having patterns that are substantially oriented at right angles to each other. Thanks to these differently oriented patterns, it is possible to detect several polarizations of incident electromagnetic radiation within a single pixel.

According to another embodiment of the invention, the part of the metallic structure associated with each elementary detection surface of a detection array comprises long thin elements forming closed concentric contours, especially contours that have a substantially square or circular shape. In particular, the contours have a square shape with an electrical conductor being formed along a diagonal of said contours. The photodetector is thus not polarization-selective. Although a square is the preferred shape for the closed concentric contours because of the optimal packing density it provides, it may nevertheless interfere with plasmonic resonance near its edges; this is a disadvantage that concentric circles do not have. In order to avoid interfering with resonance even more, the squares are electrically connected to each other via a conductor located in an area where there is already interference, namely their diagonal.

Other plasmonic structures can be used to obtain non-polarization selectivity, for example a grid of rectangular metallic bump contacts as described in the paper by Jérome Le Perchec, "Plasmon-based photosensors comprising a very thin semiconducting region", Appl. Phys. Lett. 94, 181104 (2009), or even a grid of holes formed in a metallic film that matches the grid of bump contacts.

According to another embodiment, the part of the metallic structure associated with each elementary detection surface of a detection array comprises parallel patterns with the orientation of the patterns of one elementary detection surface being different to the orientation of the patterns of the adjacent detection surface, especially at right angles. Adjacent pixels that are not sensitive to the same polarizations are obtained in this way. The signals obtained from adjacent pixels can then be combined in order to obtain detection of radiation having several polarization directions.

According to another embodiment, the part of the metallic structure associated with each elementary detection surface of a detection array comprises parallel patterns with the spatial periodicity of the patterns of one elementary detection surface being different to the spatial periodicity of the patterns of the adjacent elementary detection zone. This way, adjacent pixels are not sensitive to the same wavelength. It then becomes possible to combine the signals obtained from adjacent pixels in order to obtain detection of a wider spectrum of radiation while preserving confinement of the electromagnetic field in the semiconductor layer, or even perform multispectral radiation detection.

The semiconductor layer and the semiconductor zones advantageously consist of CdZnTe or CdHgTe.

The photodetector may, if applicable, comprise a dielectric tuning layer formed between the reflective layer and the semiconductor layer. This tuning layer makes it possible to adjust the optical frequency at which the detected radiation resonates with the geometry of the metallic structure. Thus, the geometry of the plasmonic structures, but also the thickness of this dielectric layer, are both factors that affect the sizing of the photodetector, especially in terms of its spectral sensitivity range.

BRIEF DESCRIPTION OF THE DRAWINGS

The invention will be made more readily understandable by the following description which is given merely by way of example and relates to the accompanying drawings in which identical references denote identical or analogous components and in which.

EMBODIMENTS OF THE INVENTION

Figure 1:
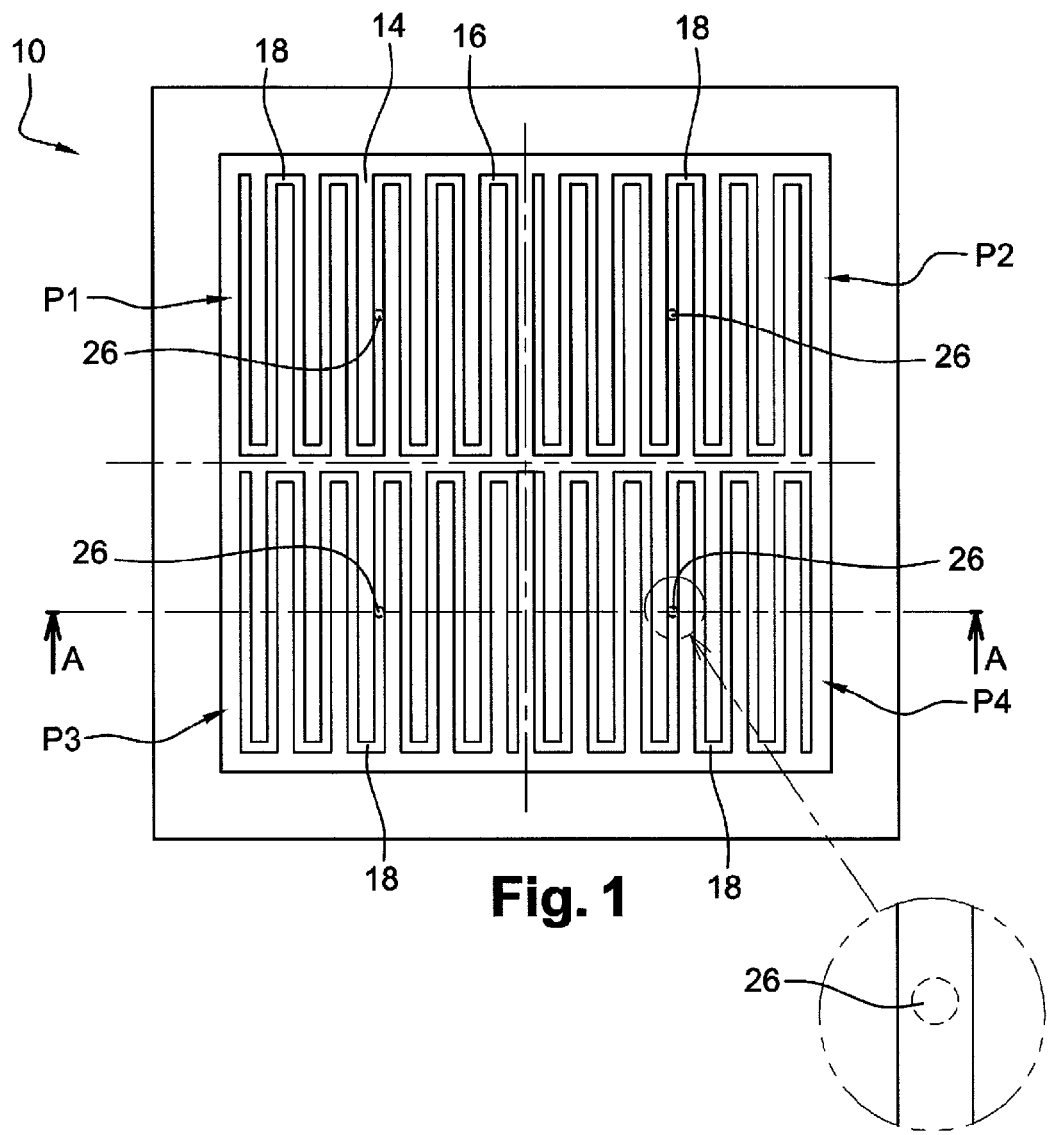
FIG. 1 is a schematic top view of a photodetector according to the invention.
Figure 2:
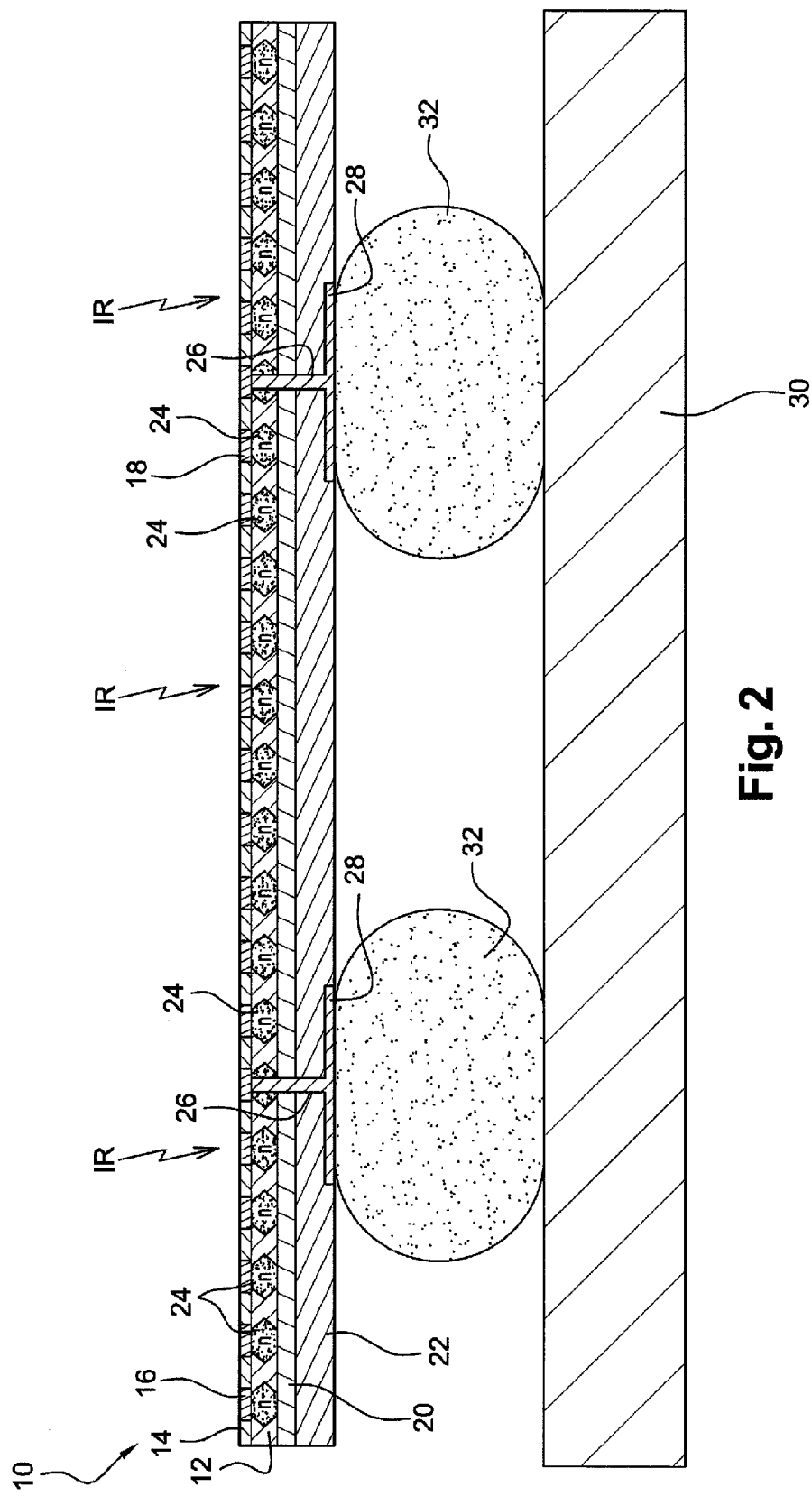
FIG. 2 is a cross-sectional view of the photodetector in FIG. 1 along line A-A.

A two-dimensional photodetector according to the invention is shown in FIGS. 1 and 2 under the general reference 10. In this example, a photodetector based on an array of 2×2 pixels P1, P2, P3, P4 is shown.

Photodetector 10 comprises:

a semiconductor absorption layer 12 that is several hundred nanometers thick wherein incident photons create electron-hole pairs; it is, for example, a p-doped semiconductor layer made of CdHgTe in order to detect middle infrared radiation (wavelength of 3 to 5 µm) and/or far infrared radiation (wavelength of 8 to 10 µm);

a passivation/insulation layer 14 that is several dozen nanometers thick or more and is deposited on semiconductor layer 12;

a metallic structure 16 made of gold, for example. Structure 16 comprises, for each pixel P1, P2, P3, P4, identical, straight, parallel metallic strips having a rectangular cross-section and connected to each other so as to form a zigzag shape. Structure 16, together with semiconductor layer 12, forms a surface plasmon resonator, as is known in itself to those skilled in the art;

a dielectric tuning layer 20 that is several dozen nanometers thick and deposited on semiconductor layer 12, for example a layer made of CdTe; and a reflective layer 22, for example a Bragg grating or a metallic reflective layer deposited on tuning layer 20.

The dimensions and the spacing of strips 18 of metallic structure 16 and the distance to reflective layer 22 are selected so that electromagnetic field IR obtained from the electromagnetic radiation that impinges on the front face of the photodetector, i.e. the face provided with structure 16, is confined in absorption layer 12 between strips 18 and over a small thickness, especially a thickness of 100 to 500 nm.

Plasmonic structures are familiar to those skilled in the art and are therefore not described here in greater detail for the sake of brevity. For more details on the operation of a plasmonic structure, the reader should, for instance, refer to Documents WO 2004/012275 and FR 2 842 945.

The photodetector also comprises a plurality of semiconductor zones 24 formed in semiconductor layer 12 that are doped differently to the semiconductor layer, for example zones made of CdHgTe with N-doping. Semiconductor zones 24 are formed in strips 18, preferably so that they are in contact with the strips and have the same topology as them.

Thus, in the embodiment described, there is one semiconductor zone 24 for each pixel P1, P2, P3, P4, this zone having a zigzag topology that is identical to that shown in FIG. 1 for the pixels.

Because of confinement of the electromagnetic field, incident radiation IR is absorbed, and therefore charge carriers are created, essentially between strips 18. The p-doped material of layer 12 and zones 24 also form a PN junction which makes it possible to collect charge carriers. Thus, in layer 12, there is a PN junction over the entire surface area of the zones where the charge carriers are created. Because of the close proximity between the zones where charges are created and the collecting zones, the distance that the charge carriers have to travel in order to be collected is minimal. This therefore optimizes the response time of the photodetector.

Moreover, since the electromagnetic field is confined between strips 18 and semiconductor zones 24 are located underneath strips 18, the space where the photocurrent is collected and the space of the dark current coincide. This produces reduced noise.

The potential difference between the p-doped material and the n-doped material of layer 12, and hence the potential difference that is applied to the PN junctions, is advantageously realized by means of a separate peripheral electrode (not shown) provided in or on layer 12 and brought to a first potential, and strips 18 that are brought to a second potential.

Also, a metal via 26 that forms a conductor, made of platinum for example, is formed for semiconductor zone 24 of every pixel P1, P2, P3, P4. Via 26 extends from reflective layer 22 to at least zone 24 as far as strip 18 of the pixel.

Note that the thickness of passivation layer 14 can be reduced, especially in order to optimize coupling between metallic structure 16 and semiconductor layer 12. In some configurations, this passivation layer 14 can even be omitted, with metallic structure 16 then being formed directly on semiconductor layer 12.

Metallic contact pads 28 are also formed on the extension of vias 26 in order to hybridize photodetector 10 on readout circuit 30 by means of solder bumps 32, made of indium for example.

It is important to note that the charges collected by the PN junctions must reach metal vias 26 in order to finally be collected. In fact, said charges take the least electrically resistive path, namely strips 18 which are therefore part of the charge collecting device.

Nevertheless, in contrast to the prior art, the only design constraint imposed on strips 18 here is dictated by the optical role that they are intended to have. In fact, the geometry and spacing of these strips are initially selected in order to define electromagnetic field concentration zones in which the photons are absorbed. Charge-carrier collection is optimal, in terms of diffusion time, if the collecting zones have, in semiconductor layer 12, a topology that complements that of the field confinement zones, namely, in the example described, a topology that is identical to that of strips 18. Adopting this procedure, the response time of the photodetector is always optimal for the chosen strip topology and, more generally speaking, the topology adopted for the plasmonic structure. The only constraint imposed on the structure is therefore a constraint of an optical nature.

Alternatively, the thickness of passivation layer 14 is reduced, by approximately several nanometers, between strips 18 and semiconductor layer 12, especially in order to optimize coupling between these two elements. It should be noted, however, that this reduced passivation thickness does not substantially interfere with plasmonic resonance. In this case, polarization of semiconductor zone 24 is obtained by using via 26.

Moreover, tuning layer 20 and, more particularly, its thickness, can make it possible to choose the frequency of the incident radiation that resonates with the surface plasmons of metallic structure 16. For further details, the readers should refer to the document entitled "Résonances photoniques dans les réseaux métalliques; théorie et application à la photodétection ultrarapide" [Photonic resonances in metal grids; theory and application to ultra-fast photodetection], by Stéphane Collin, Paris University Thesis 6, 2002.

Note that tuning layer 20 is optional, depending on the precise geometry of the plasmonic structures used, as described, for example, in the publication by J. Le Perchec et al, "Plasmon-based photosensors comprising a very thin semiconducting region", Appl. Phys. Lett. 94, 181104 (2009). Note also that if reflective layer 22 is metallic, tuning layer 20 need not play an optical role and, because of this, becomes an insulating/passivation layer with a reduced thickness.

During operation, the front face of photodetector 10, i.e. the face provided with metallic structure 16, is exposed to the radiation that is to be detected. The incident electromagnetic field is then confined between strips 18 over a small thickness. In the space thus defined, electron-hole pairs are generated by photons being absorbed by the semiconductor material of layer 12. A potential difference is applied periodically between layer 12 and semiconductor zones 24. The minority charge carriers then diffuse into zones 24 in order to be collected by means of vias 26. Note that the electrical field that is present in the charge zone of the space of the PN junction alone makes it possible to collect the minority photocarriers.

A strip 18 having a zigzag shape for every pixel is described above. This zigzag shape actually ensures electrical continuity over the entire pixel to the extent that a pixel strip 18 is also used to polarize semiconductor layer 24 located underneath it.

Figure 3:
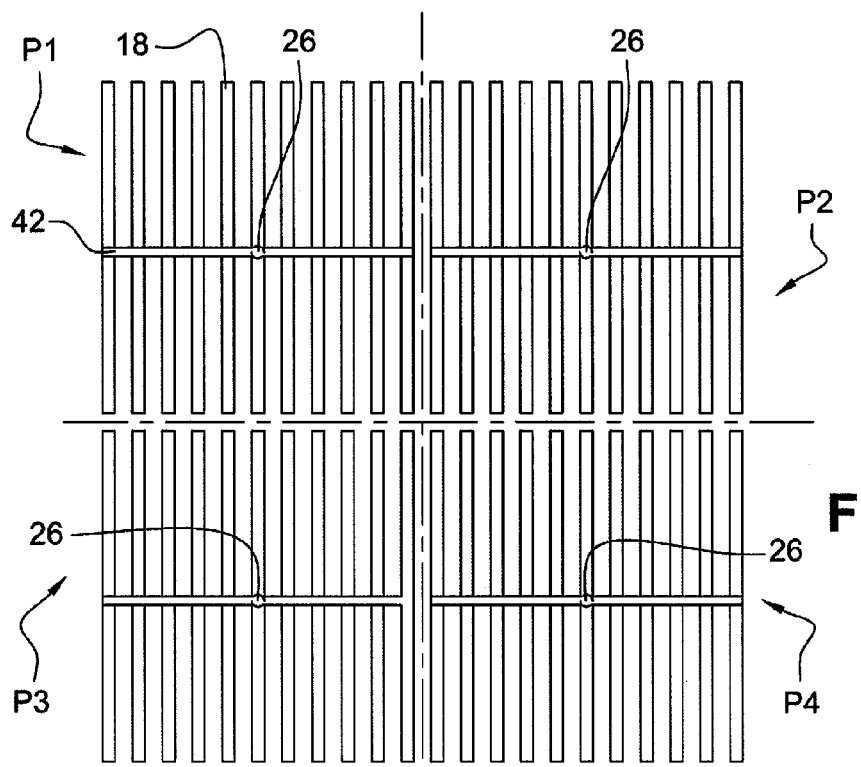
FIGS. 3 to 7 are schematic top views of several geometries of plasmonic structures according to the invention.

Other shapes can be envisaged. For example, that illustrated in FIG. 3, where, for every pixel P1, P2, P3, P4, a set of identical, straight, parallel strips 18 having a rectangular cross-section are provided and electrically interconnected by a straight central conductor 42. Similarly, a comb-shaped plasmonic structure can be provided for every pixel P1, P2, P3, P4.

Embodiments wherein the metallic plasmonic structure mostly assumes the form of identical, straight, parallel, regularly spaced strips (zigzag or separate interconnected strips) are described above. This geometry does, however, exhibit polarization selectivity. In particular, the component of the electromagnetic radiation that is polarized at right angles to the strips is only weakly detected. Other types of metallic structure geometries are, however, possible, depending on the sought-after application.

Figure 4:
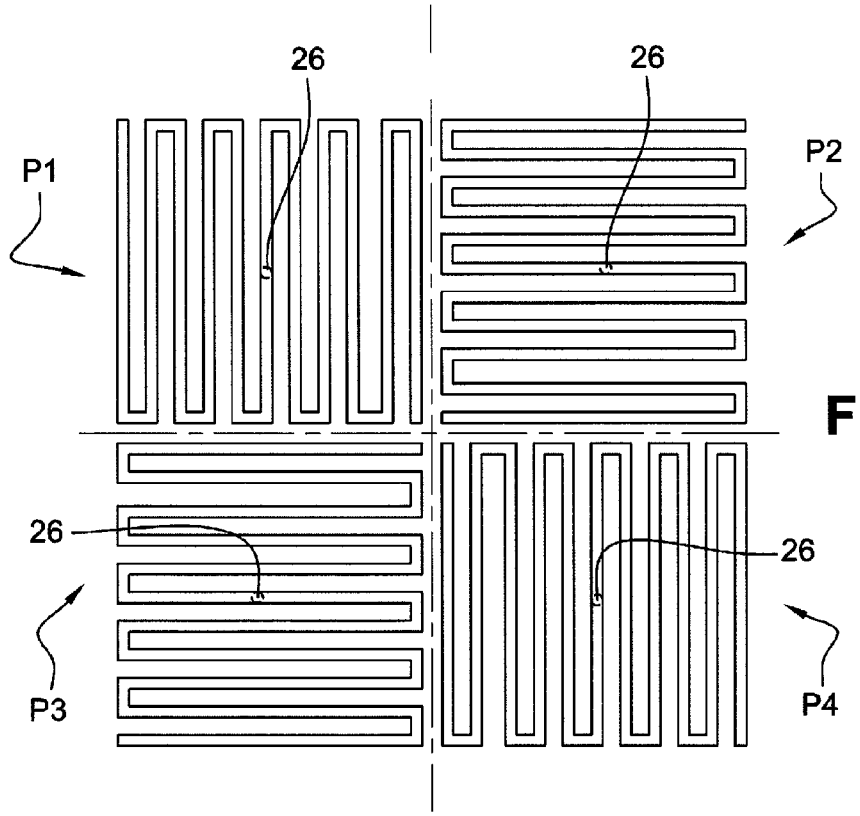

In particular, in one embodiment shown in FIG. 4, the metallic structure has orientations that are different from one pixel to another and, advantageously, orientations that are at right angles in order to detect perpendicular polarizations.

Combining the signals obtained from four adjacent pixels P1, P2, P3, P4 makes it possible to obtain a "macro pixel" that is a 2 pixel by 2 pixel square and whose signal contains perpendicular polarizations of the incident radiation.

One way of combining the signals from several pixels in order to form a macro pixel is to electrically connect contact pads 28 of these pixels or to provide, in readout circuit 30, tracks that connect the corresponding solder bumps 32 in parallel. Semiconductor zones 24 of the pixels are then electrically connected in parallel, thus forming the macro pixel. This optimizes the optical packing density and/or spectral response of the detector or even its polarization sensitivity. This parallel connection of the semiconductor zones can also be permanent or non-permanent. For example, the semiconductor zones can be connected in parallel by using controllable switches.

Other types of orientations are possible, for example in order to detect two electromagnetic radiations having different linear polarizations. The orientation of the strips is then selected depending on the polarization of these fields.

Figure 5:
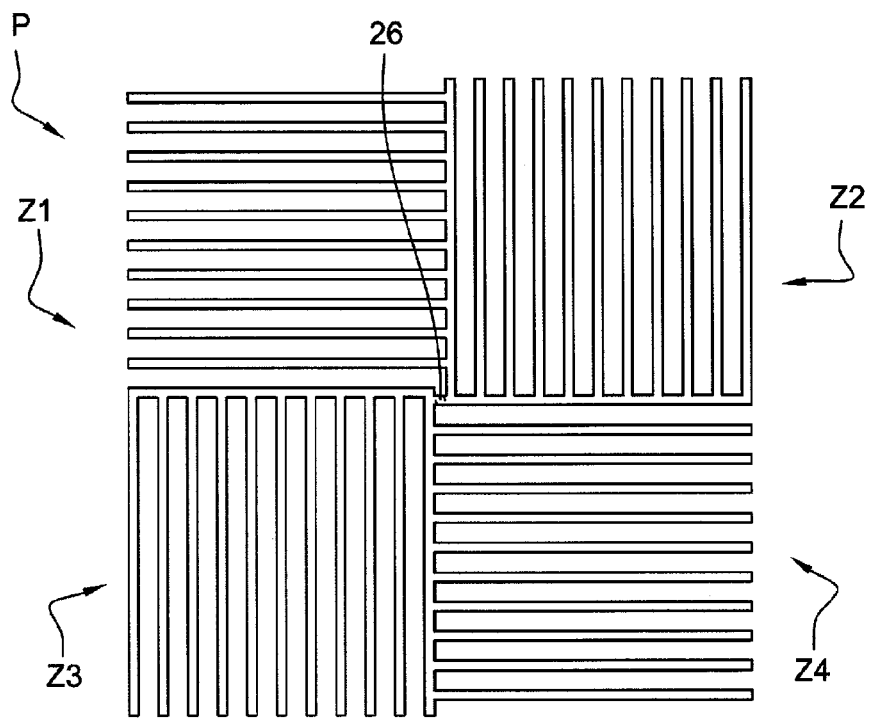

Rather than detecting different polarizations by combining the signals obtained from adjacent pixels, detection of different polarizations can be obtained directly by using a single pixel P having four perpendicular combs Z1, Z2, Z3, Z4 as a plasmonic structure with a tooth of one comb being used as a support for an adjacent comb, as shown in FIG. 5. Via 26 is placed in the centre of pixel P and the latter thus comprises strips having different orientations (perpendicular in this example).

Figure 6:
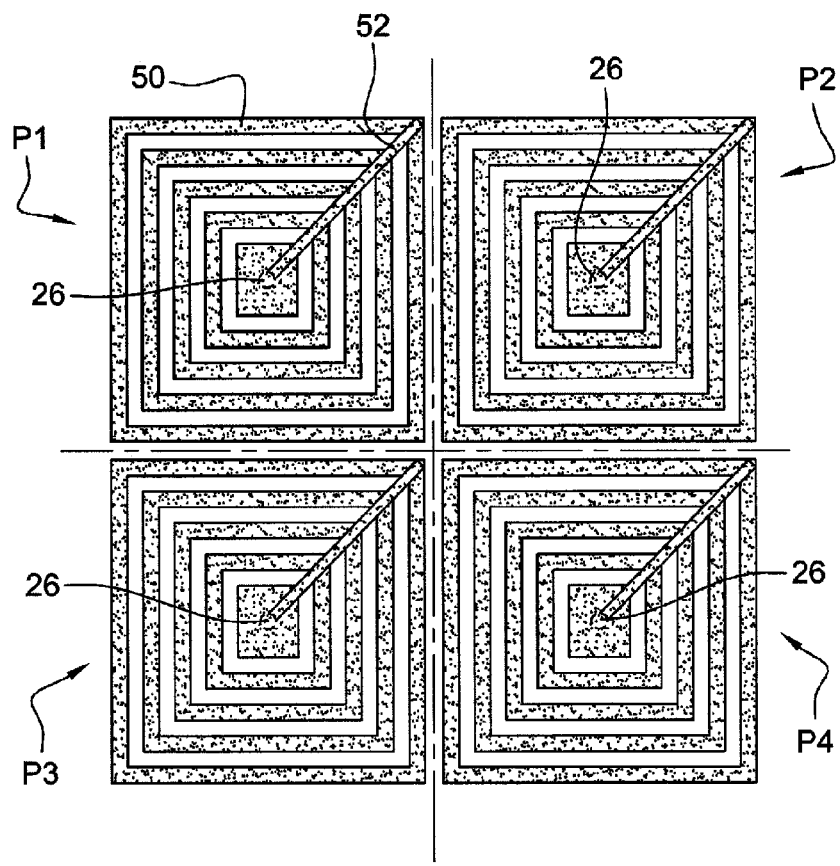

In order to make detection independent of polarization of the incident radiation, strips 50 form, for each pixel P1, P2, P3, P4, closed concentric, electrically connected contours, as shown in FIG. 6. In order to maximize the pixel packing density of the photodetector, the closed contours are advantageously square shaped, although other types of contours can be envisaged, e.g. concentric circular contours or even grids of bump contacts having a defined shape. Advantageously, if strips 50 have a square shape, a conductor 52 is located on one of their diagonals to ensure their electrical connection in order to minimize interference with plasmonic resonance.

Moreover, the width and spacing of the strips control the resonance frequency of the surface plasmons and hence the frequency at which the quantum efficiency of the photodetector exhibits high gain. Thus, providing a width and spacing that are unique to the metallic structure implies that the photodetector will be used for a predetermined frequency range. A photodetector that is sensitive to several frequency ranges may be required.

Figure 7:
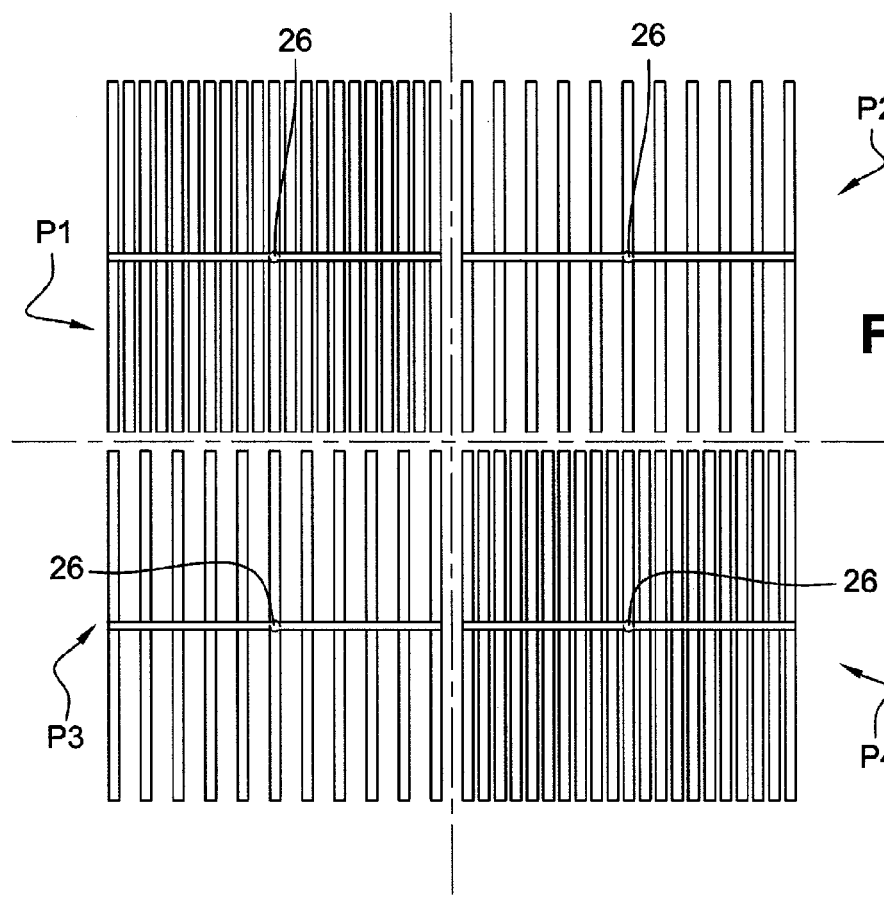

To achieve this, the metallic structure may comprise areas where strips having a first width and/or a first spacing alternate with other zones where the strips have a different width and/or spacing in order to obtain detection that is sensitive to several frequency ranges. FIG. 7 shows such detection which is sensitive to two frequency ranges with four adjacent pixels having their signals combined in order to obtain one macro pixel measuring two pixels by two pixels. It should be noted that the layout in FIG. 5 with its single metallic via 26 can also be used to obtain a pixel that is sensitive to two frequency ranges. Also note that a zigzag or comb shape can also be used for the plasmonic structure.

It is also possible to combine the above embodiments in order to obtain detection with several polarizations and several frequency ranges.

An example of the method for fabricating a detector made of CdHgTe in which the n-doped semiconductor zones 24 are formed in p-doped semiconductor layer 12 underneath plasmonic structure 16 is described below:

1. Grow absorption layer 12 made of CdHgTe on a CdZnTe substrate by molecular-beam epitaxy;
2. deposit dielectric tuning layer 20 by cathode sputtering and then deposit reflective layer 22 by using the same deposition method;
3. create a peripheral electrical contact on layer 12 by etching layer 20 down to material 24 and then deposit metal for the contact pad;
4. anneal this assembly in order to obtain p doping in the CdHgTe layer, for example between 200° C. and 300° C. for several hours;
5. machine vias 26 as far as the CdHgTe layer, this creates annular semiconductor zones having the same polarity as zone 24 and forms contact pads 28;
6. hybridize the assembly thus obtained on circuit 30 by means of solder bumps 32;
7. make the substrate of circuit 30 thinner;
8. deposit passivation layer 14 on absorption layer 12;
9. deposit a resin, followed by exposure using a mask having the same topology as metallic structure 16;

10. etch passivation layer 14 emerging into absorption layer 12 through the cross-linked resin; this has the effect of producing zones 24 of opposite polarity to 12 and aligned with the resin pattern;
11. deposit the metal that constitutes metallic structure 16; and
12. lift-off the metal: remove the resin and the metal deposited on the latter thus obtaining self-alignment of 16 and 24 because the same resin exposure is used.

Fabrication of via 26 and contact pad surfaces 28 for hybridization on readout circuit 30 are described above.

Alternatively, the photodetector is not intended to be hybridized and vias 26 and contact surfaces 28 are consequently omitted. The charge carriers are then collected by means of metallic structure 16.

Embodiments wherein the electromagnetic field is confined between the solid parts of the plasmonic structure, for example between the strips and semiconductor collecting zones underneath the solid parts of said structure, for example underneath the strips, are described above.

Alternatively, the electromagnetic field is confined underneath the solid parts of the metallic structure and the semiconductor collecting zones are produced between the solid parts. For example, FIG. 8 shows a cross-sectional view of a pixel according to an embodiment that differs from that described in relation to FIGS. 1 and 2 in terms of:
- the dimensions and spacing of strips 18 of metallic structure 16 which are selected so that electromagnetic field IR is confined in absorption layer 12 underneath strips 18;
- semiconductor zone 24 which is formed between strips 18;
- passivation layer 14 which is thicker; and
- strips 18 which are formed in passivation layer 14 so that they are electrically insulated from semiconductor zone 24.

The charge carriers are collected by the PN junction when the latter is subjected to a potential difference and then move into semiconductor zone 24, eventually reaching via 26 where they are ultimately collected.

Figure 8:
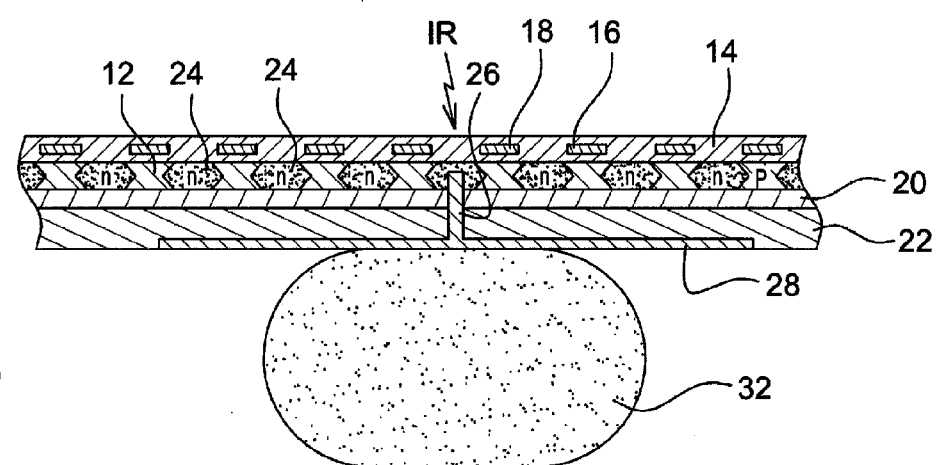
FIG. 8 is a schematic cross-sectional view of a photodetector according to a second embodiment.
Figure 8:
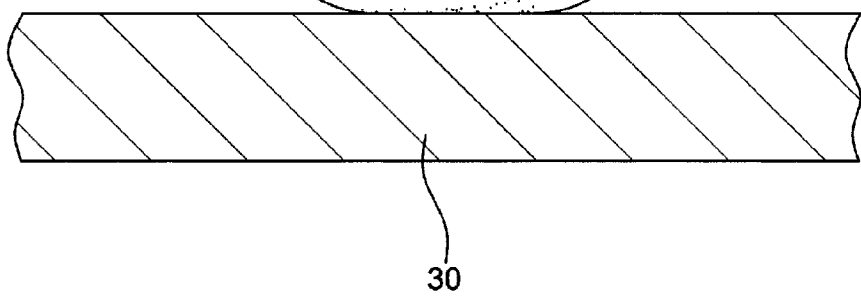

A method for fabricating a photodetector according to the embodiment shown in FIG. 8 is, for example, described below:
1. Grow absorption layer 12 made of CdHgTe on a CdZnTe substrate by molecular-beam epitaxy;
2. deposit dielectric tuning layer 20 by cathode sputtering and then deposit reflective layer 22;
3. create a peripheral electrical contact on layer 12;
4. anneal this assembly in order to obtain p doping in the CdHgTe layer, for example between 200° C. and 300° C. for several hours;
5. machine vias 26 as far as the CdHgTe layer, this creates an n-doped semiconductor zone around via 26 and forms contact pads 28;
6. hybridize the assembly thus obtained on circuit 30 by means of solder bumps 32;
7. make the substrate of circuit 30 thinner;
8. deposit passivation layer 14 on absorption layer 12;
9. deposit a layer of metal that constitutes the plasmonic structure on layer 14;
10. deposit a resin, followed by exposure using a mask having the same topology as metallic structure 16;
11. remove the portion of exposed resin;
12. etch the metal in the area where the resin was removed, this etching can be extended into semiconductor layer 12 so as to form semiconductor zones 24. Alternatively, semiconductor zones 24 are produced by ion implantation;
13. exposure and removal of remaining resin so as to reveal strips 18; and
14. deposit a new insulating layer in order to encapsulate strips 18 in passivation layer 14.

Embodiments in which semiconductor layer 12 is p-doped and the semiconductor zones are n-doped are described above. Obviously, the invention also applies in the case of an n-doped semiconductor layer and p-doped semiconductor zones 24.

The invention claimed is:

1. A photo-detector capable of detecting electromagnetic radiation comprising: a doped semiconductor absorption layer for said radiation, capable of converting said radiation into charge carriers; a reflective layer that reflects the incident radiation that is not absorbed by the semiconductor layer towards the latter, located underneath said semiconductor layer; and a metallic structure placed on the semiconductor layer that forms, with said semiconductor layer, a surface plasmon resonator so as to concentrate the incident electromagnetic radiation on the metallic structure in field concentration zones of the semiconductor layer, wherein semiconductor zones for collecting charge carriers are oppositely doped to the doping of the semiconductor layer and are formed in said semiconductor layer in locations of the semiconductor layer that are devoid of field concentration zones and have a topology that complements that of the field concentration zones, and wherein it comprises, for each elementary detection surface of a detection array, a conductor that passes through the photo-detector from the reflective layer to at least one semiconductor collecting zone.

2. The photodetector as claimed in claim 1:
   wherein the metallic structure comprises spaced-apart structures, the geometry and spacing of the structures relative to each other being selected so that the field concentration zones are produced between the structures;
   and wherein the semiconductor collecting zones are produced underneath said spaced-apart structures and have the same topology as that of said structure.

3. The photodetector as claimed in claim 2, wherein the structures are located so that they are in contact with the semiconductor collecting zones.

4. The photodetector as claimed in claim 1:
   wherein the metallic structure comprises spaced-apart structures, the geometry and spacing of said structures relative to each other being selected so that the field concentration zones are produced underneath said structures;
   and wherein the semiconductor zones are produced between said structures and have the same topology as the space lying between said structure.

5. The photodetector as claimed in claim 4, wherein the semiconductor zones are electrically insulated from the structures, especially by means of a passivation layer.

6. The photodetector as claimed in claim 1, wherein the conductor passes through the semiconductor layer to a structure, said structures which are associated with the elementary detection surface being capable of being electrically connected to each other.

7. The photodetector as claimed in claim 1, wherein the conductor comprises on the same side as reflective layer, a contact pad surface for hybridizing the photodetector on an electronic circuit.

8. The photodetector as claimed in claim 1, wherein the part of the metallic structure associated with each elementary detection surface of a detection array comprises areas having differently orientated parallel patterns, especially areas having patterns that are substantially oriented at right angles relative to each other.

9. The photodetector as claimed in claim 1, wherein a part of the metallic structure associated with each elementary detection surface of a detection array comprises long thin elements forming closed concentric contours, especially contours that have a substantially square or circular shape.

10. The photodetector as claimed in claim 9, wherein the contours have a square shape with an electrical conductor being formed along a diagonal of said contours.

11. The photodetector as claimed in claim 1, wherein a part of the metallic structure associated with each elementary detection surface of a detection array comprises parallel patterns with the orientation of the patterns of one elementary detection surface being different to the orientation of the patterns of the adjacent detection surface, especially at right angles.

12. The photodetector as claimed in claim 1, wherein a part of the metallic structure associated with each elementary detection surface of a detection array comprises parallel patterns with the spatial periodicity of the patterns of one elementary detection surface being different to the spatial periodicity of the patterns of the adjacent elementary detection surface.

13. The photodetector as claimed in claim 1, wherein the semiconductor layer and the semiconductor zones are made of CdZnTe or CdHgTe.

* * * * *